United States Patent
Wiesa et al.

(10) Patent No.: US 11,071,203 B2
(45) Date of Patent: Jul. 20, 2021

(54) CIRCUIT SUBSTRATE ARRANGEMENT WITH IMPROVED ELECTRICAL CONTACT

(71) Applicant: Robert Bosch GmbH, Stuttgart (DE)

(72) Inventors: Thomas Wiesa, Vaihingen (DE); Andreas Meier, Pfullingen (DE); Stefan Huehner, Kusterdingen—Jettenburg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/963,668

(22) PCT Filed: Dec. 5, 2018

(86) PCT No.: PCT/EP2018/083617
§ 371 (c)(1),
(2) Date: Jul. 21, 2020

(87) PCT Pub. No.: WO2019/145077
PCT Pub. Date: Aug. 1, 2019

(65) Prior Publication Data
US 2021/0076497 A1 Mar. 11, 2021

(30) Foreign Application Priority Data
Jan. 23, 2018 (DE) .............. 10 2018 201 022.6

(51) Int. Cl.
*H05K 1/05* (2006.01)
*H05K 1/11* (2006.01)
(Continued)

(52) U.S. Cl.
CPC ............ *H05K 1/119* (2013.01); *H01L 23/142* (2013.01); *H01L 23/3735* (2013.01);
(Continued)

(58) Field of Classification Search
CPC ................. H05K 1/11–119; H05K 1/05–056
See application file for complete search history.

(56) References Cited

U.S. PATENT DOCUMENTS

| 4,562,301 A | 12/1985 | Kameda et al. |
| 5,189,261 A | 2/1993 | Alexander et al. |

(Continued)

FOREIGN PATENT DOCUMENTS

| EP | 0298855 | 1/1989 |
| JP | 5843595 | 3/1983 |

(Continued)

OTHER PUBLICATIONS

International Search Report for Application No. PCT/EP2018/083617 dated Mar. 28, 2019 (English Translation, 2 pages).

*Primary Examiner* — Jeremy C Norris
(74) *Attorney, Agent, or Firm* — Michael Best & Friedrich LLP

(57) ABSTRACT

The present invention relates to a circuit substrate arrangement comprising a base layer (2) made from aluminium, a circuit layer (3) made from copper, a dielectric layer (4) arranged between the base layer (2) and the circuit layer (3), an opening (5) passing through the base layer (2), the circuit layer (3) and the dielectric layer (4) and an electrical contact (6) between the base layer (2) and the circuit layer (3), wherein the electrical contact (6) comprises a rivet (7), wherein a frictionally connected joint (8) is formed between the rivet (7) and the base layer (2) and wherein an integrally bonded joint (9) is formed between the rivet (7) and the circuit layer (3).

9 Claims, 2 Drawing Sheets

(51) Int. Cl.
*H01L 23/14* (2006.01)
*H01L 23/373* (2006.01)

(52) U.S. Cl.
CPC ............. *H05K 1/053* (2013.01); *H05K 1/116* (2013.01); *H05K 2201/10303* (2013.01)

(56) References Cited

U.S. PATENT DOCUMENTS

| | | | |
|---|---|---|---|
| 6,747,217 | B1 | 6/2004 | Jochym et al. |
| 7,957,156 | B2 * | 6/2011 | Palomo ................ H01R 12/585 361/779 |
| 2005/0286238 | A1 | 12/2005 | Joy |
| 2018/0326924 | A1 * | 11/2018 | Haraguchi ............... H01R 4/02 |

FOREIGN PATENT DOCUMENTS

| | | |
|---|---|---|
| JP | 0221776 | 2/1990 |
| WO | 2017104518 | 6/2017 |

* cited by examiner

CIRCUIT SUBSTRATE ARRANGEMENT WITH IMPROVED ELECTRICAL CONTACT

BACKGROUND

The present invention relates to a circuit carrier arrangement with a significantly improved electrical contact-connection.

Different refinements of circuit carrier arrangements are known from the prior art. For example, so-called IMSs (isolated metal substrates) in the form of single-layer or multilayer printed circuit boards which are laminated onto a metal substrate, in particular containing copper or aluminum, are known. Said metal substrate allows improved thermal spreading of the power loss. However, here, copper-based IMSs are considerably more expensive than aluminum-based IMSs, with the design otherwise remaining the same. In addition to the base layer, the IMS further comprises a copper-based circuit layer and a dielectric intermediate layer between the base layer and the circuit layer. However, if the base layer is an aluminum-based layer, electrical contact problems arise between the base layer (aluminum) and circuit layer (copper) which are based on different metal substrates.

SUMMARY

In contrast, the circuit carrier arrangement according to the invention has the advantage that an improved contact-connection is possible with different metal substrates of the circuit carrier arrangement. A base layer, which comprises aluminum, and a circuit layer, which comprises copper, which are separated from one another by a dielectric intermediate layer can be used here. In this case, the electrical contact-connection can be embodied in a very simple and cost-effective manner and allows a particularly high degree of robustness, this leading to major advantages, in particular when used in moving devices, such as vehicles for example. According to the invention, an electrical contact between the base layer, which comprises aluminum, and the circuit layer, which comprises copper, is provided by way of a rivet, wherein a force-fitting connection is formed between the rivet and the base layer, and a cohesive connection is formed between the rivet and the circuit layer. Therefore, the rivet is connected to the two different metal layers by two different connections. The circuit carrier arrangement has an opening in which the rivet is arranged. Therefore, the less expensive base layer, which comprises aluminum, can be used for the circuit carrier arrangement without problems, this resulting in a wide spectrum of use since the electrical contact-connection between the different metal substrates can be considerably improved.

The opening is preferably a passage opening. The opening is preferably made after the three layers of the circuit carrier arrangement are put together. As an alternative, the opening is a blind hole.

Further preferably, a length of the rivet is smaller than a length of the opening here. This results in at least one region in the opening of the circuit carrier arrangement that is not occupied by the rivet. This creates different design options. Firstly, the rivet can be arranged only partially in the base layer and/or only partially in the circuit layer. This creates clearances at the first and the second end of the rivet that can be used for different purposes.

Particularly preferably, the rivet comprises a head, in particular a flat head. The head particularly preferably rests on the circuit layer. The cohesive connection is preferably formed between the head and the circuit layer.

The cohesive connection is preferably established by means of a solder.

As an alternative, the rivet is in the form of a pin without a head, and therefore the rivet can be arranged completely in the opening in the circuit carrier arrangement. Particularly preferably, a first end of the rivet terminates flush with a surface of the circuit layer in this case, wherein the solder of the cohesive connection then completely covers the first end of the rivet. As an alternative, the first end of the rivet is arranged in a manner recessed in the opening in such a way that the rivet is only partially in contact with the wall of the opening in the circuit layer, and therefore a region of the opening that is filled with solder is produced at the cohesive connection between the rivet and the circuit layer. Particularly preferably, the solder goes beyond an edge region of the opening on the circuit layer in this case in order to allow a secure electrical contact-connection between the rivet and the circuit layer.

The circuit carrier arrangement according to the invention is particularly preferably used in a DC/DC converter, in particular in conjunction with electrical machines.

BRIEF DESCRIPTION OF THE DRAWINGS

Exemplary embodiments of the invention will be described in detail below with reference to the accompanying drawing, in which.

DETAILED DESCRIPTION

A circuit carrier arrangement 1 according to a first preferred exemplary embodiment of the invention will be described in detail below with reference to FIGS. 1 and 2.

Figure 1:
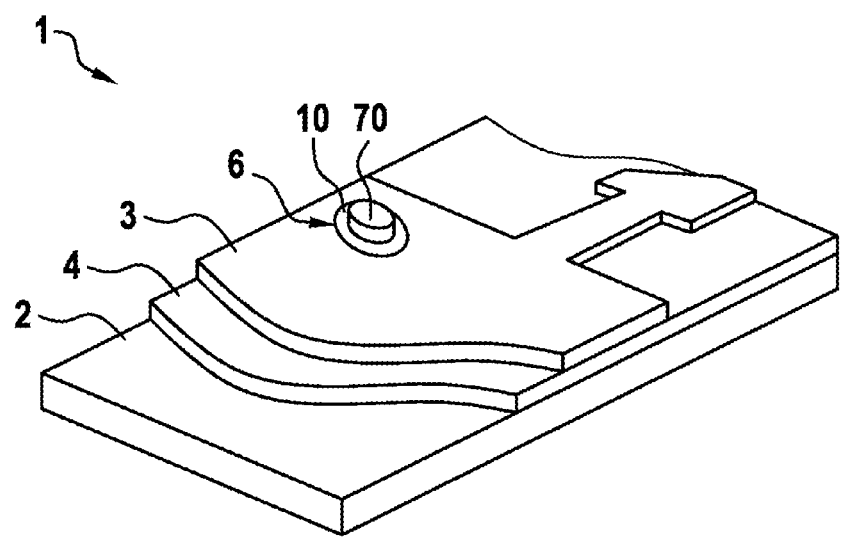
FIG. 1 shows a schematic, perspective illustration of a circuit carrier arrangement according to a first exemplary embodiment of the invention.

As is clear from FIG. 1, the circuit carrier arrangement 1 of this exemplary embodiment is a so-called IMS (insulated metal substrate) comprising a base layer 2, which comprises aluminum, a dielectric layer 4 and a circuit layer 3, which comprises copper.

The dielectric layer 4 is arranged as an intermediate layer between the base layer 2 and the circuit layer 3 and electrically isolates these two layers. Here, the dielectric layer 4 is applied directly to the base layer 2, and the circuit layer 3 is applied directly to the dielectric layer 4.

Owing to the use of an aluminum-based base layer, a particularly cost-effective circuit carrier arrangement 1 can be provided in comparison to other materials for the base layer, wherein, in particular, high thermal outputs can be reliably dissipated through the base layer 2 which comprises aluminum. This is highly advantageous particularly in conjunction with high-power electronic components, for example MOSFETs, IGBTs, transformers and/or coils. Therefore, a build-up of heat on the high-power electronic components can be avoided.

The use of the aluminum-based base layer 2 has a significant price advantage in comparison to the use of copper-based base layers for example, wherein almost the same thermal conductivities of the base layers are achieved in practice.

Figure 2:
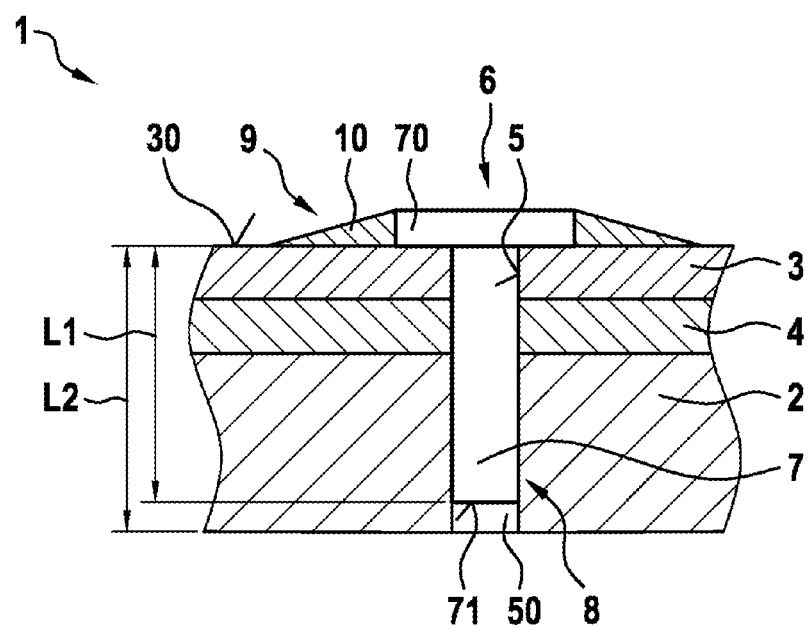
FIG. 2 shows a schematic sectional view of the circuit carrier arrangement from FIG. 1.

As shown in detail in FIG. 2, the circuit carrier arrangement 1 further comprises at least one opening, preferably a plurality of openings 5 which are provided as passage openings through the circuit carrier arrangement 1, wherein a center axis of the opening 5 is perpendicular to a surface of the circuit carrier arrangement 1.

An electrical contact 6 which comprises a rivet 7 is provided in order to establish an electrical connection between the circuit layer 3 and the base layer 2. In this exemplary embodiment, the rivet 7 is a cylindrical rivet composed of a solid material which has a head 70. As shown in FIG. 2, the head 70 rests on a surface 30 of the circuit layer 3 in the assembled state.

The electrical contact 6 is now connected to the base layer 2 and the circuit layer 3 by two different types of connection. Here, a force-fitting connection 8 is provided between the rivet 7 and the base layer 2, and a cohesive connection 9 is provided between the circuit layer 3 and the rivet 7. In this exemplary embodiment, the cohesive connection is formed at the head 70 of the rivet. In this case, the cohesive connection is established by means of a solder 10 which is arranged along the outer periphery of the head 70.

As is further clear from FIG. 2, the rivet 7 has a first length L1, and the opening 5 in the circuit carrier arrangement 1 has a second length L2. The first length L1 is smaller than the second length L2 here. This produces a region 50, which is not filled by the rivet 7, in the opening 5 on a first end 71.

In this case, the electrical contact-connection by means of the force-fitting connection 8 between the base layer 2 and the rivet 7 allows very good electromagnetic compatibility with reduced potential for interference.

The rivet 7 is preferably produced from brass or copper and has a coated surface, preferably a gold or tin coating.

The cohesive connection 9 by means of the solder 10 is particularly preferably made by means of a reflow soldering process.

Therefore, in the circuit carrier arrangement 1, an electrical contact-connection is obtained by means of two different types of connection, specifically a force-fitting connection 8 for connection to the base layer 2 and a cohesive connection 9 for connection to the circuit layer 3, which electrical contact-connection achieves a particularly robust electrical contact-connection between layers which comprise different materials, specifically the base layer which is produced substantially from aluminum and the circuit layer 3 which is produced substantially from copper.

Figure 3:
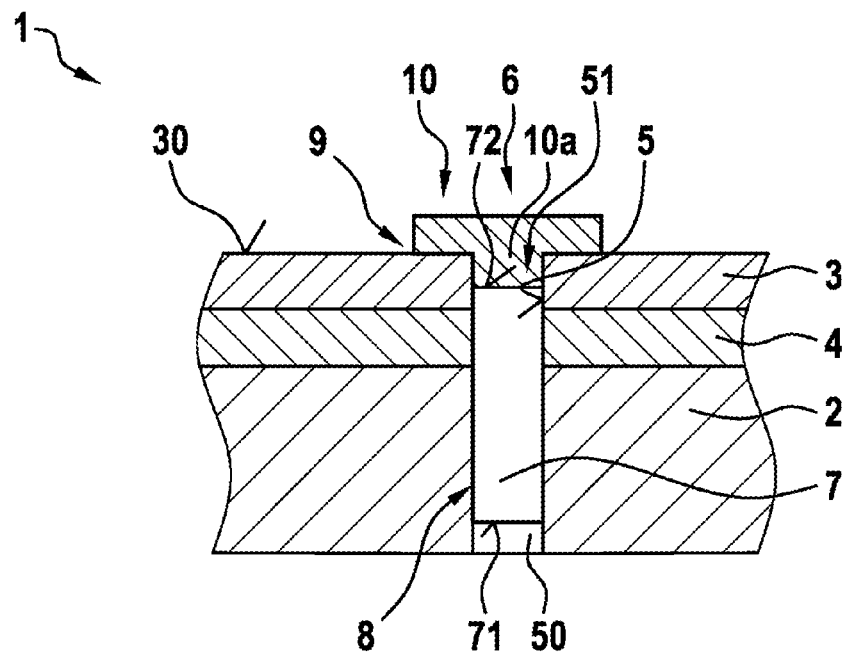
FIG. 3 shows a schematic sectional view of a circuit carrier arrangement according to a second exemplary embodiment of the invention.

FIG. 3 shows a circuit carrier arrangement 1 according to a second exemplary embodiment of the invention, wherein identical or functionally identical parts are identified by the same reference signs. As is clear from FIG. 3, the rivet 7 of the electrical contact 6 is exclusively a cylindrical rivet without a head. Here, the rivet 7 is recessed completely in the opening 5. Here, the first region 50 at the first end 71 of the rivet 7 in the opening remains free and also a second region 51 at the free or second end 72 of the rivet 7 remains free. In the final state, a solder region 10a of the solder 10 of the cohesive connection 9 is then present in the region 51 and fills this region 51, as is schematically shown in FIG. 3.

Figure 4:
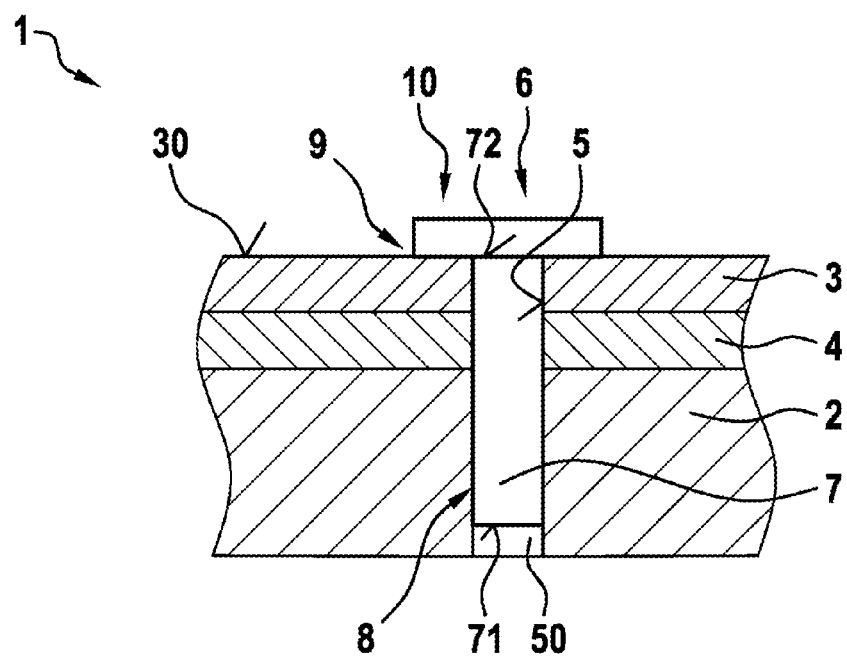
FIG. 4 shows a schematic sectional view of a circuit carrier arrangement according to a third exemplary embodiment of the invention.

FIG. 4 shows a circuit carrier arrangement 1 according to a third exemplary embodiment which substantially corresponds to the second exemplary embodiment. The rivet 7 likewise does not have a head and is provided with a cylindrical geometric shape. However, the second end 72 of the rivet 7 is arranged flush with a surface 30 of the circuit layer 3 here. In this case, the solder 10 of the cohesive connection 9 covers the second end of the rivet 7 and establishes the electrical contact to the circuit layer 3.

Therefore, as shown in the preferred exemplary embodiments, a very cost-effective printed circuit board with an aluminum-based base layer 2 and a copper-based circuit layer 3 can be produced according to the invention. In this case, the electrical contact-connection between the base layer 2 and the circuit layer 3 is made by means of a rivet 7 which is connected in a force-fitting manner in one instance and in a cohesive manner in one instance.

The invention claimed is:

1. A circuit carrier arrangement, comprising:
an insulated metal substrate including:
a base layer (2) which comprises aluminum,
a circuit layer (3) which comprises copper, and
a dielectric layer (4) which is arranged between the base layer (2) and the circuit layer (3),
an opening (5) which runs through the base layer (2), the circuit layer (3) and the dielectric layer (4) of the insulated metal substrate, and
an electrical contact (6) between the base layer (2) and the circuit layer (3), wherein the electrical contact (6) comprises a rivet (7),
wherein a force-fitting connection (8) is formed between the rivet (7) and the base layer (2), and
wherein a cohesive connection (9) is formed between the rivet (7) and the circuit layer (3).

2. The circuit carrier arrangement as claimed in claim 1, wherein the opening (5) is a passage opening.

3. The circuit carrier arrangement as claimed in claim 1, wherein a first length (L1) of the rivet (7) is smaller than a second length (L2) of the opening (5).

4. The circuit carrier arrangement as claimed in claim 1, wherein the rivet (7) comprises a head (70).

5. The circuit carrier arrangement as claimed in claim 4, wherein the head (70) rests on a surface (30) of the circuit layer (3), and the cohesive connection (9) is formed between the head (70) and the circuit layer (3).

6. The circuit carrier arrangement as claimed in claim 1, wherein the rivet (7) has a cylindrical shape without a head.

7. The circuit carrier arrangement as claimed in claim 6, wherein the rivet (7) has a free end (72) which terminates flush with the surface (30) of the circuit layer (3), wherein the cohesive connection (9) covers the free end (72) of the rivet (7).

8. The circuit carrier arrangement as claimed in claim 6, wherein a free end (72) of the rivet (7) is arranged in the opening (5) of the circuit carrier arrangement in such a way that a region (51) which is filled with solder (10a) of the cohesive connection (9) is provided in the opening (5).

9. The circuit carrier arrangement as claimed in claim 8, wherein the solder (10) of the cohesive connection (9) goes beyond the opening (5) and establishes an electrical contact-connection on the surface (30) of the circuit layer (3).

* * * * *